(12) United States Patent
Borer et al.

(10) Patent No.: US 7,464,362 B1
(45) Date of Patent: Dec. 9, 2008

(54) METHOD AND APPARATUS FOR PERFORMING INCREMENTAL COMPILATION

(75) Inventors: Terry Borer, Toronto (CA); David Karchmer, Los Altos, CA (US); Jason Govig, San Jose, CA (US); Andrew Leaver, Los Altos, CA (US); Gabriel Quan, Toronto (CA); Kevin Chan, Scarborough (CA); Vaughn Betz, Toronto (CA); Stephen D. Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 223 days.

(21) Appl. No.: 11/384,962

(22) Filed: Mar. 20, 2006

(51) Int. Cl.
*G06F 17/50* (2006.01)

(52) U.S. Cl. ....................................................... 716/18
(58) Field of Classification Search ........................ None
See application file for complete search history.

(56) References Cited

U.S. PATENT DOCUMENTS

| 6,102,964 A * | 8/2000 | Tse et al. ........................ 716/18 |
| 7,076,751 B1 * | 7/2006 | Nixon et al. .................... 716/5 |
| 7,206,967 B1 * | 4/2007 | Marti et al. .................... 714/25 |

* cited by examiner

*Primary Examiner*—Leigh Marie Garbowski
(74) *Attorney, Agent, or Firm*—L. Cho

(57) ABSTRACT

A method for designing a system on a target device includes merging a post-fit netlist for a first partition of the system from a set-up compilation with a post-synthesis netlist for a second partition of the system from an incremental compilation to form a combined netlist. Fitting is performed on the combined netlist.

17 Claims, 7 Drawing Sheets

US 7,464,362 B1

METHOD AND APPARATUS FOR PERFORMING INCREMENTAL COMPILATION

TECHNICAL FIELD

The present invention relates to electronic design automation tools for designing systems on target devices. More specifically, the present invention relates to a method and apparatus for performing incremental compilation.

BACKGROUND

Some known incremental compilation technologies for field programmable gate array (FPGA) designs rely on the placement of at least part of the design to be written out in the form of user assignments following a successful compilation. This procedure is referred to as "back-annotation". In subsequent compilations, the design is recompiled together with the user assignments in an effort to preserve results and to reduce compilation time. Incremental compilation technologies based on back-annotation, however, are susceptible to data mismatch. Data mismatch may cause back-annotated placement to become unusuable. User assignments generated via back-annotation take a simple name-value pair form, with the name denoting a textual identifier of a circuit node and the value indicating a location on the device. For a system designer to be able to reuse one of such assignment, the name must refer to a valid node in the current netlist. Unfortunately, a given name often cannot be found in the back-annotated netlist for a number of reasons. First, a node name generation algorithm may be perturbed by even a slight change to the project. Second, optimizations such as physical synthesis often change a netlist significantly. This may cause nodes to be created or deleted during compilation. In a subsequent compilation, these changes may not yet have been reproduced with the assignments that are being applied, or they may not be reproducible at all. With the lack of valid assignments, the system designer may need to recompile a major portion of the design.

Other known incremental compilation technologies employ a hierarchical flow, referred to as a bottom-up flow, where each block of a design is developed separately and potentially in parallel. The full design is generated by combining the individual blocks together. Since blocks are developed independently without knowledge of other blocks in the bottom-up flow, it is impossible for the system design to carry out global optimizations on the blocks. To facilitate global optimizations between blocks, a designer may be required to manually create timing assignments. This process is referred to as delay budgeting. Delay budgeting may become tedious and time consuming when there are several inter-block paths in a design.

Thus, what is needed is an improved method and apparatus for performing compilation.

SUMMARY

According to an embodiment of the present invention, a method and apparatus for performing incremental compilation on a design for a system is disclosed. During set-up compilation, the system is partitioned into logical sections. A post-fit netlist for a first partition of the system is generated and a post-fit netlist for a second partition of the system is generated. During incremental compilation the post-fit netlist for the first partition of the system from the set-up compilation is merged with a post-synthesis netlist for a second partition of the system from the incremental compilation to form a combined netlist. Fitting is performed on the combined netlist. By performing fitting on a combined netlist that includes a post-fit netlist, embodiments of the present invention need not rely on back-annotation which may result in data mismatch. In addition, by performing fitting on a combined netlist that merges both a netlist from the first and second partition, global optimizations may be achieved.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that specific details in the description may not be required to practice the embodiments of the present invention. In other instances, well-known components, programs, and procedures are shown in block diagram form to avoid obscuring embodiments of the present invention unnecessarily.

Figure 1:
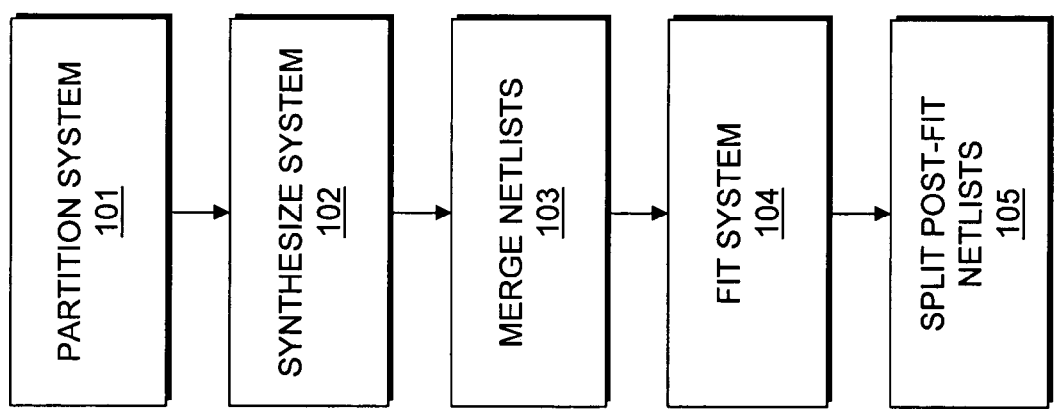
FIG. 1 is a flow chart illustrating a method for performing set-up compilation according to an embodiment of the present invention.
Figure 2:
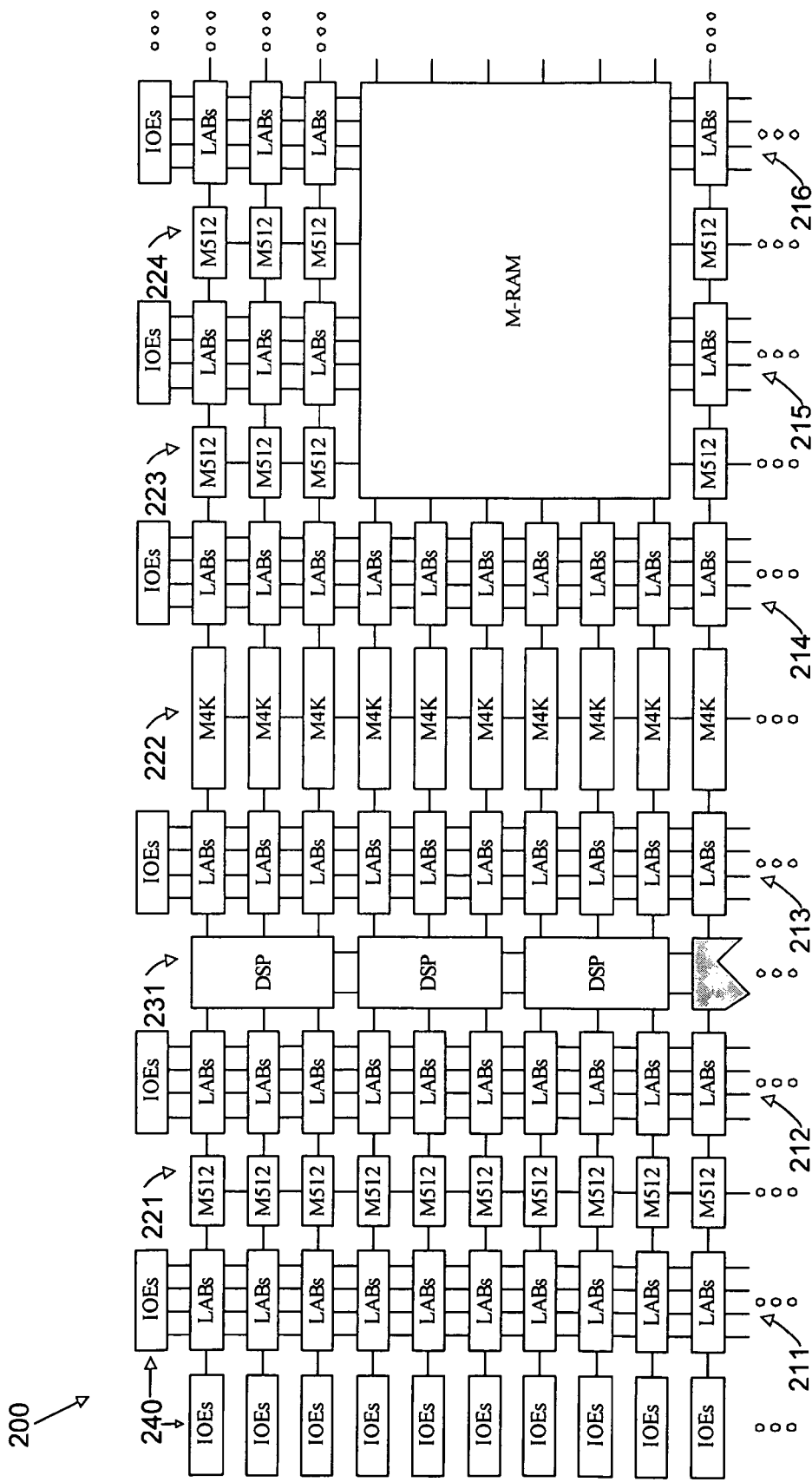
FIG. 2 illustrates a field programmable gate array (FPGA) according to an embodiment of the present invention.

FIG. 1 is a flow chart illustrating a method for designing a system on a target device according to an embodiment of the present invention. The target device may be an FPGA, ASIC, a structured ASIC, or other device. FIG. 2 illustrates an exemplary target device 200 in which a system may be implemented on according to an embodiment of the present invention. The target device 200 is an FPGA having a chip with a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells and registers. According to one embodiment of the present invention, the logic block may operate similarly to a logic element (LE), or adaptive logic module (ALM), such as those found in Stratix™ and Stratix II™ manufactured by Altera® Corporation, or a slice such as those found in Virtex™, Virtex-II™, Virtex-II Pro™, or Virtex-4™ manufactured by Xilinx® Inc. In this embodiment, the logic block may include a four input lookup table (LUT) with a configurable register. Columns of LABs are shown as 211-216. It should be appreciated that the logic block may include additional or alternate components.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections. The target device 200 also includes a plurality of row and column interconnect lines (not shown) that span fixed distances. Dedicated row and column interconnect lines, route signals to and from LABs, DSP blocks, and memory blocks within the same row and column, respectively.

FIG. 2 illustrates an exemplary embodiment of a target device. It should be appreciated that a system may include a plurality of target devices, such as that illustrated in FIG. 2, cascaded together. It should also be appreciated that the target device may include FPGAs arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera™ Corporation in its APEX™, Stratix™, Cyclone™, Stratix™ II, Cyclone™ II, MAX II™, Hardcopy™, Harcopy II™, Stratix GX™, and Stratix II GX™ families of chips and those employed by Xilinx® Inc. in its Spartan™, Spartan-II™, Spartan-3™, Virtex™, Virtex™ II, Virtex™ II Pro, and Virtex IV™ line of chips.

Referring back to FIG. 1, at 101, the system is partitioned into a plurality of partitions where each partition represents a logical section of the system. According to an embodiment of the present invention, partitioning may be performed manually by a designer, with the assistance of a tool, or using a combination of techniques.

At 102, the system is synthesized. Synthesis includes generating a logic design of the system to be implemented by a target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device. According to an embodiment of the present invention, a post-synthesis netlist is generated for each of the partitions in the system from mapping. This post-synthesis netlists may be an optimized technology-mapped netlist generated from the HDL.

At 103, the post-synthesis netlists for each of the partitions in the system are merged together to form a combined netlist. Boundary ports are inserted into the merged netlist to identify and preserve the partitions in the system. The boundary ports are used to prevent cross-partition optimizations to be performed on the combined netlist. According to an embodiment of the present invention, the boundary ports may be implemented as atoms on the combined netlist.

Figure 3:
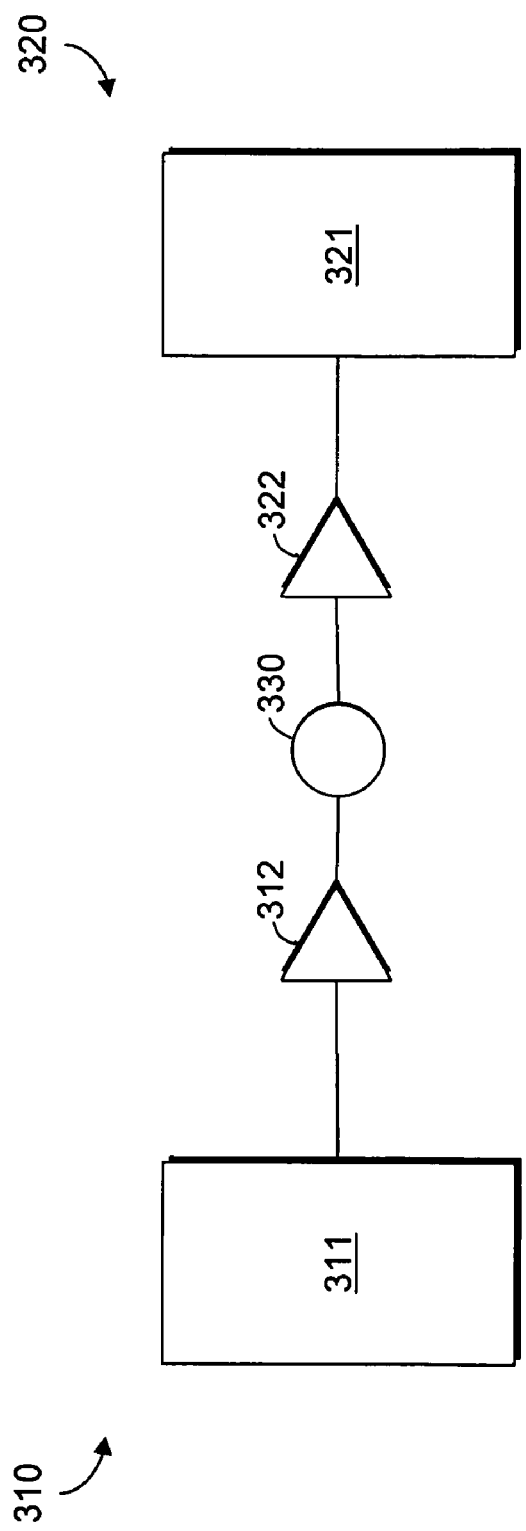
FIG. 3 illustrates an example of using boundary ports to enforce partitions according to an embodiment of the present invention.

FIG. 3 illustrates an example of using boundary ports to enforce partitions according to an embodiment of the present invention. In this example, components in a first partition 310 include, in part, a register 311 and an inverter 312. Components in a second partition 320 include, in part, a register 321 and an inverter 322. Boundary port 330 may be inserted to identify a boundary between the first partition 310 and the second partition 320. By identifying boundary between partitions in a combined netlist, hierarchies may remain independent from one other during compilation procedures. This would make it possible to incrementally re-compile each hierarchy.

Referring back to FIG. 1, at 104, the system is fitted. According to an embodiment of the present invention, fitting involves placing the mapped logical system design on the target device. Placement works on the optimized technology-mapped netlist to produce a placement for each of the functional blocks. According to an embodiment of the present invention, placement includes fitting the system on the target device by determining which resources on the target device are to be used for specific logic elements and functional blocks. After mapping, it is determined which routing resources should be used to connect the functional blocks in the system. According to an embodiment of the present invention, routing may be performed in response to routing constraints provided. Design rule checking may be performed on a per-operation basis, where before a modification is made to a netlist, a check is conducted to ensure that cross-partition optimizations are not made. A post-fit netlist is generated from the fitting.

At 105, the post-fit netlist is split. According to an embodiment of the present invention, the single post-fit netlist for the system may be split at the boundary ports to produce one post-fit netlist for each partition in the system.

Figure 4:
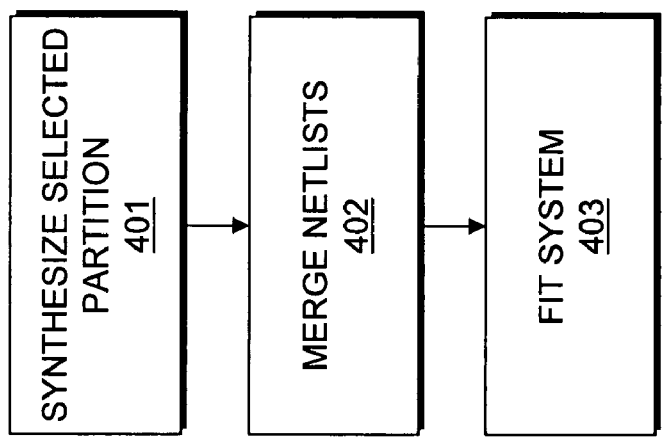
FIG. 4 is a flow chart illustrating a method for performing incremental compilation according to an embodiment of the present invention.

FIG. 4 is a flow chart illustrating a method for performing incremental compilation according to an embodiment of the present invention. The incremental compilation procedure may be performed after the set-up compilation described with reference to FIG. 1. At 401, one or more selected partitions may be selected to be synthesized. According to an embodiment of the present invention, the results from a set-up compilation may be evaluated to identify whether any of the partitions of the system satisfy system requirements such as timing or power requirements for example. The partitions that do not satisfy system requirements may be selected for synthesis in the incremental compilation (re-synthesis). Partitions with results from the set-up compilation that meet system requirements may be preserved or "locked down". Synthesis may be performed as described with reference to 102 (shown in FIG. 1). According to an embodiment of the present invention, a post-synthesis netlist is generated for each partition selected to be synthesized from mapping. These post-synthesis netlists may be an optimized technology-mapped netlist generated from the HDL.

At 402, the netlists for the partitions in the system are merged together to form a combined netlist. According to an embodiment of the present invention, the one or more post-synthesis netlists generated at 401 are merged with post-fit netlists previously generated during set-up that have been locked down. As described at 103, boundary ports are inserted into the merged netlist to identify and preserve the partitions in the system and to prevent cross-partition optimizations to be performed on the combined netlist.

At 403, the system is fitted. According to an embodiment of the present invention, fitting may be performed as described with reference to 104 shown in FIG. 1 where placement and routing is performed. By performing fitting on a combined netlist that includes a post-synthesis netlist for a first partition and a post-fit netlist for a second partition that is locked down, global optimizations may be achieved without having cross-partition optimizations.

According to an embodiment of the present invention, when partitioning a system, a partition with no logic may be specified. In this embodiment, the empty netlist would include an interface that defines its connectivity. The interface may include virtual pins. These virtual pins may be given a specific location on the target device and can accept timing constraints just as physical input output pins. By creating an empty partition, an incomplete design may be compiled and have its timing analyzed as if the design was fully specified. When the empty partition is ready to be implemented, timing of the other existing partitions should be valid.

According to an alternate embodiment of the present invention, empty partitions may be generated for all partitions of a design except for one. The non-empty partition may be compiled and optimized until all constraints are satisfied. The designer may then select one of the remaining empty partitions and fill it with a design. This partition may be compiled and optimized as well. This procedure may be repeated until all the partitions are compiled and optimized.

Figure 5:
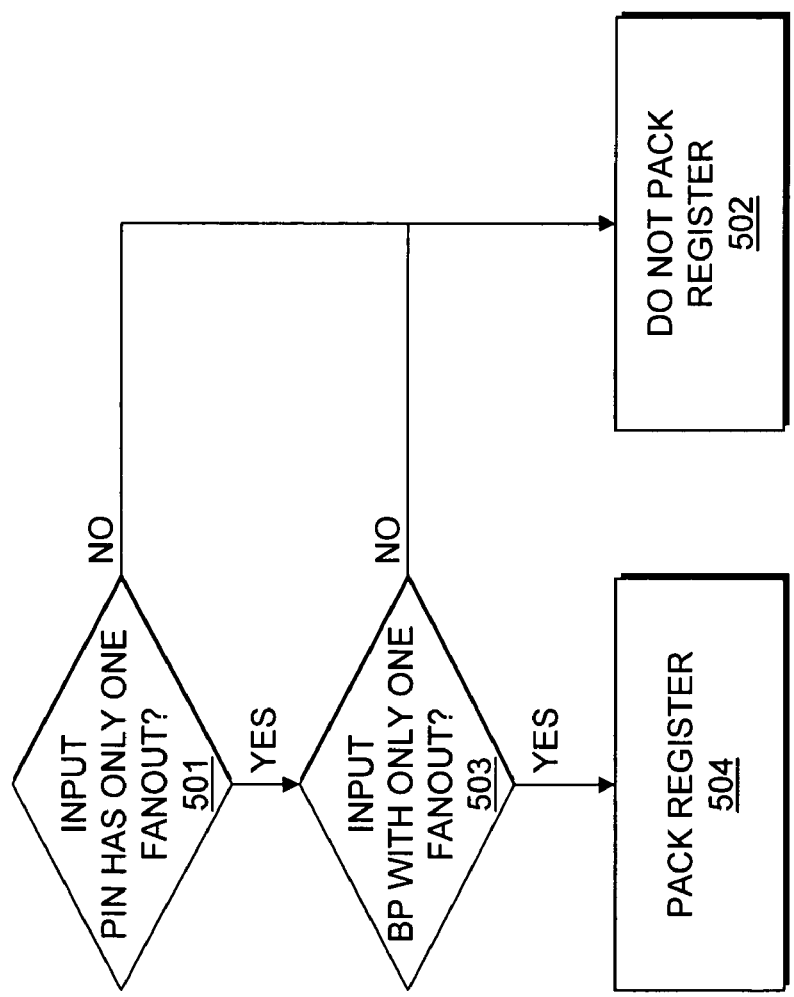
FIG. 5 is a flow chart illustrating a method for determining when to perform cross-partition register packing for input pins according to an embodiment of the present invention.

Many resource elements such as logic blocks, DSP blocks, memory blocks, and input output elements on an FPGA include built-in registers. Register packing may be performed by a system designer in order to satisfy timing constraints. FIG. 5 is a flow chart illustrating a method for determining when to perform cross-partition register packing for input pins according to an embodiment of the present invention. In this embodiment, the pin and register reside in different partitions. At 501, it is determined whether an input pin has only one fanout. If it is determined that the input pin has more than one fanout, control proceeds to 502. If it is determined that the input pin has only one fanout, control proceeds to 503.

At 502, cross-partition register packing for the input pin is not performed.

At 503, it is determined whether an input boundary port (BP) has only one fanout. If it is determined that an input boundary port has more than one fanout, control proceeds to 502. If it is determined that an input boundary port has only one fanout, control proceeds to 504.

At 504, cross-partitioning packing is performed.

Figure 6:
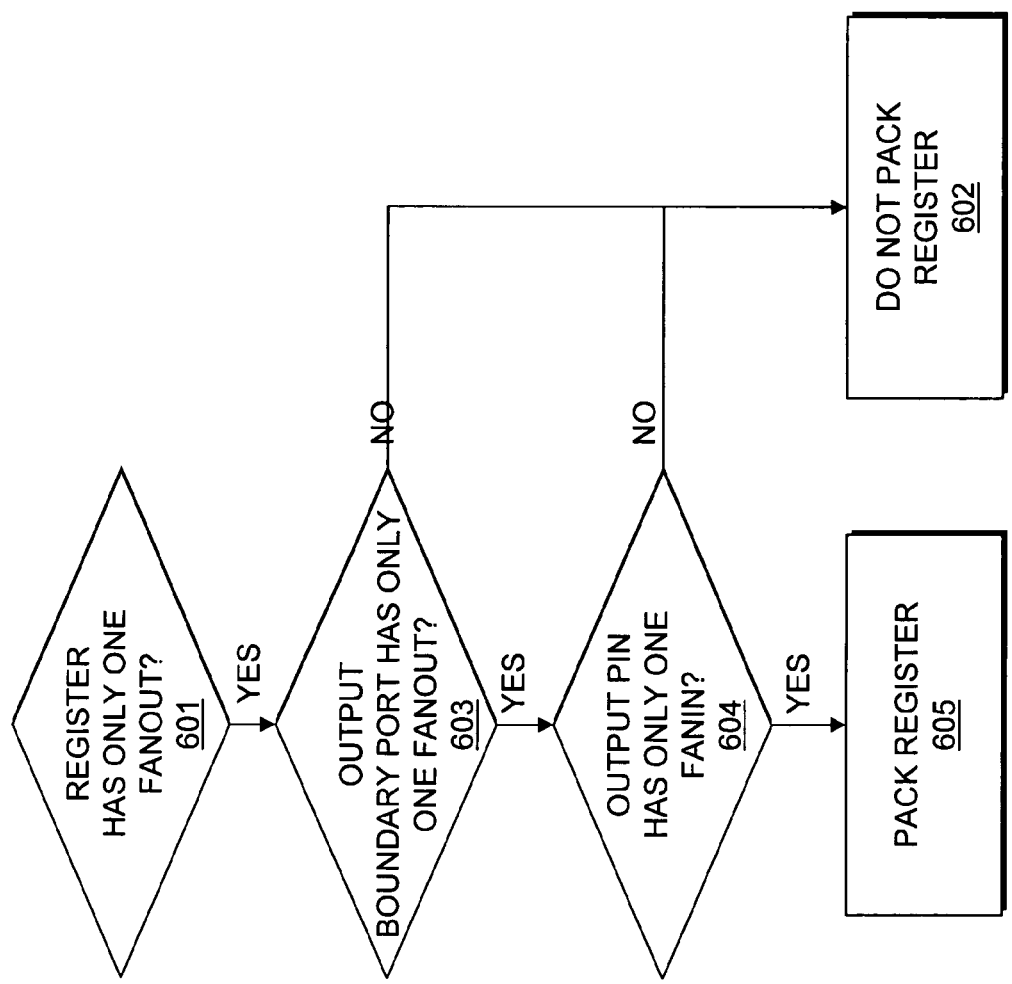
FIG. 6 is a flow chart illustrating a method for determining when to perform cross-partition register packing for output pins according to an embodiment of the present invention.

FIG. 6 is a flow chart illustrating a method for determining when to perform cross-partition register packing for output pins according to an embodiment of the present invention. In this embodiment, the pin and register reside in different partitions. An output pin with an output enable signal is assigned to a partition that has an associated design source file describing the tri-state output behavior. At 601, it is determined whether a register has only one fanout. If it is determined that the register has more than one fanout, control proceeds to 602. If it is determined that the register has only one fanout, control proceeds to 603.

At 602, cross-partition register packing for the output pin is not performed.

At 603, it is determined whether an output boundary port has only one fanout. If it is determined that an output boundary port has more than one fanout, control proceeds to 602. If it is determined that an output boundary port has only one fanout, control proceeds to 604.

At 604, it is determined whether the output pin has only one fanin. If it is determined that the output has more than one fanin, control proceeds to 602. If it is determined that the output pin has only one fanin, control proceeds to 605.

At 606, cross-partitioning register packing for the output pin is performed.

FIGS. 1, and 4-6 are flow charts illustrating methods according to embodiments of the present invention. Some of the techniques illustrated in these figures may be performed sequentially, in parallel, or in an order other than that which is described. It should be appreciated that not all of the techniques described are required to be performed, that additional techniques may be added, and that some of the illustrated techniques may be substituted with other techniques.

Figure 7:
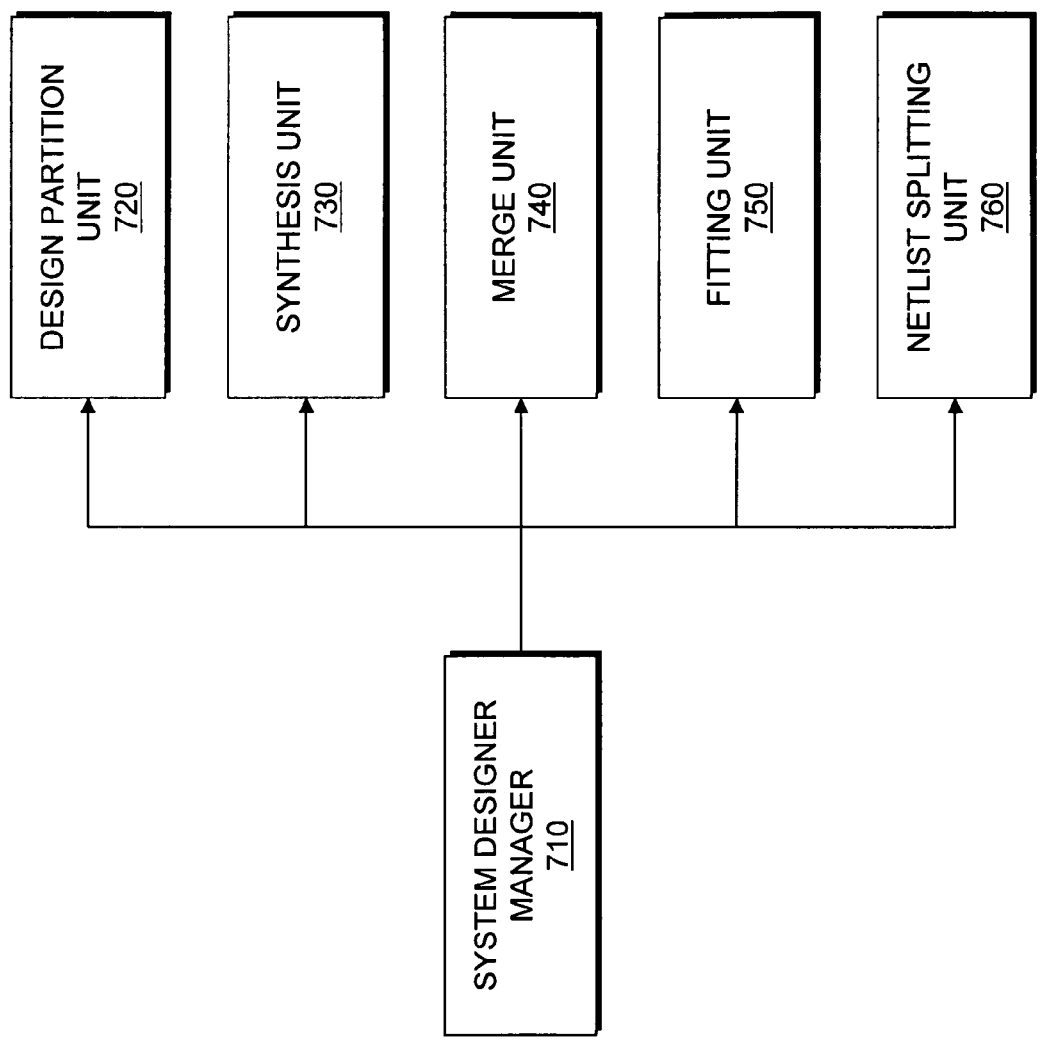
FIG. 7 illustrates a system designer according to an embodiment of the present invention.

FIG. 7 illustrates a system designer 700 according to an embodiment of the present invention. The system designer 700 may be an EDA tool. FIG. 7 illustrates software modules implementing an embodiment of the present invention. According to one embodiment, system design may be performed by a computer system (not shown) executing sequences of instructions represented by the software modules shown in FIG. 7. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 700 includes a system designer manager 710. The system designer manager 710 is coupled to and transmits information between components in the system designer 700.

The system designer 700 includes a design partition unit 720. The design partition unit 720 partitions a system design into a plurality of partitions where each partition represents a logical section of the system. According to an embodiment of the system designer, the design partition unit 720 may partition the system according to instructions provided by a designer, with the assistance of a tool, or using a combination of techniques.

The system designer 700 includes a synthesis unit 730. The synthesis unit 730 generates a logic design of a system to be implemented by a target device. According to an embodiment of the system designer 700, the synthesis unit 730 takes a conceptual Hardware Description Language (HDL) design definition and generates an optimized logical representation of the system. The optimized logical representation of the system generated by the synthesis unit 730 may include a representation that has a minimized number of functional blocks and registers, such as logic gates and logic elements, required for the system. Alternatively, the optimized logical representation of the system generated by the synthesis unit 730 may include a representation that has a reduced depth of logic and that generates a lower signal propagation delay. The synthesis unit 730 also determines how to implement the functional blocks and registers in the optimized logic representation utilizing specific resources on a target device, thus creating an optimized post-synthesis netlist for each of the partitions in the system. The post-synthesis netlists indicate how the resources on the target device can be utilized to implement the system. The post-synthesis netlists may, for example, include components such as LEs on the target device.

The system designer 700 includes a merge unit 740. The merge unit 740 merges netlists associated with partitions in the system to form a combined netlist. According to an embodiment of the system designer 700, the merge unit 740 merges the post-synthesis netlists for each of the partitions in the system to form a combined netlist. Boundary ports are inserted into the merged netlist to identify and preserve the partitions in the system. The boundary ports are used to prevent cross-partition optimizations to be performed on the combined netlist. According to an embodiment of the present invention, the boundary ports may be implemented as atoms on the combined netlist.

The system designer 700 includes a fitting unit 750. The fitting unit 750 fits the system on the target device by determining which resources on the target device are to be used for specific functional blocks and registers. According to an embodiment of the system designer 700, the fitting unit 750 first determines how to implement portions of the optimized logic design in clusters. Clusters may represent a subset of the components on the target device such as, for example, a LAB having a plurality of logic blocks. In this embodiment, after portions of the optimized logic design are implemented in clusters, the clusters may be placed by assigning the clusters to specific LABs on the target device. Following the placement of the clusters, routing interconnections between the logic blocks may be performed. A cost function may be used to determine a good assignment of resources on the target device. The fitting unit 750 also determines the routing resources on the target device to use to provide interconnection between the functional blocks and registers on the target device. The fitting unit 750 generates a single post-fit netlist for the system.

The system designer manager 710 may operate as a boundary port manager to determine if a change to a netlist is permitted. The system designer manager 710 may determine that an optimization is not permitted due to the existence of boundary ports and forbid a cross-partition optimization from taking place.

The system designer 700 includes a netlist splitting unit 760. According to an embodiment of the system designer 700, the netlist splitting unit 760 splits the single post-fit netlist. The single post-fit netlist may be split at the boundary ports to produce one post-fit netlist for each partition in the system.

According to an embodiment of the present invention, the results from a set-up compilation may be evaluated to identify whether any of the partitions of the system satisfy system requirements such as timing or power requirements for example. The partitions that do not satisfy system requirements may be selected for synthesis in an incremental compilation. Partitions with results from the set-up compilation that meet system requirements may be preserved or "locked down". The merging unit 740 may merge a post-fit netlist for a first partition of the system generated from a set-up compilation that meets system requirements with a post-synthesis netlist for a second partition of the system generated from an incremental compilation to form a combined netlist. The fitting unit 750 may perform fitting on the combined netlist.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
   partitioning the system into a first partition and a second partition during a set-up compilation;
   merging a post-fit netlist for the first partition from the set-up compilation with a post-synthesis netlist for a second partition of the system from an incremental compilation to form a combined netlist;
   inserting boundary ports on the combined netlist to prevent cross-partition optimizations during fitting; and
   performing fitting on the combined netlist.

2. The method of claim 1, wherein performing fitting on the combined netlist comprises utilizing location assignments originating from the post-fit netlist for the first partition.

3. The method of claim 1, wherein performing fitting on the combined netlist comprises performing optimizations with respect to both the first partition and the second partition.

4. The method of claim 1, wherein the set-up compilation comprises:
   performing synthesis on the first partition and the second partition of the system;
   merging a post-synthesis netlist for the first partition with a post-synthesis netlist for the second partition;
   performing fitting on the system; and
   partitioning a netlist generated from fitting into the post-fit netlist for the first partition and a post-fit netlist of the second partition.

5. The method of claim 4, wherein the first partitions is an empty partition.

6. The method of claim 1, further comprising performing synthesis on only the second partition of the system during incremental compilation.

7. An article of manufacture comprising a machine accessible medium including sequences of instructions, the sequences of instructions including instructions which when executed cause the machine to perform:

partitioning a system into a first partition and a second partition during a set-up compilation;

merging a post-fit netlist for the first partition from the set-up compilation with a post-synthesis netlist for a second partition of the system from an incremental compilation to form a combined netlist;

inserting boundary ports on the combined netlist to prevent cross-partition optimizations during fitting; and performing fitting on the combined netlist.

8. The article of manufacture of claim 7, wherein performing fitting on the combined netlist comprises utilizing location assignments originating from the post-fit netlist for the first partition.

9. The article of manufacture of claim 7, wherein performing fitting on the combined netlist comprises performing optimizations with respect to both the first partition and the second partition.

10. The article of manufacture of claim 7, further comprising instructions which when executed cause the machine to further perform synthesizing only the second partition of the system during incremental compilation.

11. The article of manufacture of claim 7, wherein the set-up compilation comprises:

performing synthesis on the first partition and the second partition of the system;

merging a post-synthesis netlist for the first partition with a post-synthesis netlist for the second partition;

performing fitting on the system; and partitioning a netlist generated from fitting into the post-fit netlist for the first partition and a post-fit netlist of the second partition.

12. The article of manufacture of claim 11, wherein the first partition is an empty partition.

13. A system designer comprising:

a design partition unit to partition a system into a first partition and a second partition during a set-up compilation;

a merging unit to merge a post-fit netlist for the first partition from the set-up compilation with a post-synthesis netlist for the second partition from an incremental compilation to form a combined netlist and to insert boundary ports on the combined netlist to prevent cross-partition optimization during fitting; and a fitting unit to perform fitting on the combined netlist.

14. The apparatus of claim 13, further comprising a synthesis unit to perform synthesis and mapping on the partitioned system.

15. The apparatus of claim 13, wherein the fitting unit performs placement and routing on the combined netlist.

16. The apparatus of claim 13, further comprising a netlist splitting unit to split a post-fit netlist generated by the fitting unit during the set-up compilation into the post-fit netlist for the first partition and a post-fit netlist for the second partition.

17. The apparatus of claim 13, wherein the fitting unit utilizes location assignments originating from the post-fit netlist for the first partition.

* * * * *